United States Patent
Nakamura

(10) Patent No.: US 6,368,937 B1
(45) Date of Patent: Apr. 9, 2002

(54) METHOD OF MANUFACTURING SEMICONDUCTOR DEVICE

(75) Inventor: Shunji Nakamura, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/456,532

(22) Filed: Dec. 8, 1999

(30) Foreign Application Priority Data

Aug. 30, 1999 (JP) .............................................. 11-244026

(51) Int. Cl.$^7$ ........................ H01L 21/76; H01L 21/425
(52) U.S. Cl. ........................ 438/401; 438/529; 438/975
(58) Field of Search .................................. 438/296, 401, 438/529, 975

(56) References Cited

U.S. PATENT DOCUMENTS

| | | | |
|---|---|---|---|
| 5,401,691 A | * | 3/1995 | Caldwell |
| 5,693,976 A | * | 12/1997 | Chao |
| 5,795,803 A | * | 8/1998 | Takamura et al. |
| 5,814,552 A | * | 9/1998 | Lu |
| 5,889,335 A | * | 3/1999 | Kuroi et al. |
| 5,966,614 A | * | 10/1999 | Park et al. |

OTHER PUBLICATIONS

Patent Abstracts of Japan; 11054607 A; dated Feb. 26, 1999.

* cited by examiner

*Primary Examiner*—John F. Niebling
*Assistant Examiner*—Ron Pompey
(74) *Attorney, Agent, or Firm*—Armstrong, Westerman & Hattori, LLP

(57) ABSTRACT

A process of etching a semiconductor substrate and forming a trench which becomes a positioning mark on the semiconductor substrate, forming a burying film to fill the trench, forming a mask layer having an aperture to expose the trench, introducing an impurity to the trench with the mask layer used as the mask, and recessing the burying film in the trench which becomes the positioning mark.

20 Claims, 8 Drawing Sheets

RELATIONSHIP BETWEEN ION IMPLANTATION AMOUNT
AND ETCHING RATE OF OXIDE FILM INJECTED

METHOD OF MANUFACTURING SEMICONDUCTOR DEVICE

BACKGROUND OF THE INVENTION

1. Field of the Invention

The present invention relates to a method of manufacturing a semiconductor device and, more particularly, to a method of manufacturing a semiconductor device to form a positioning mark in the element isolating process.

2. Description of the Related Art

In recent years, the manufacture of semiconductor devices is often accompanied by many lithographic processes. In this case, the positioning mark is formed as the reference to accurately align the mask position.

This positioning mark can be formed by forming a "step" on a base film or a substrate by selective etching or by selective oxidation. A position may be detected by optically detecting such a step for the positioning between the semiconductor substrate and the mask.

For example, there is provided a technique called LOCOS (Local Oxidation of Silicon) as a method of element isolation in a semiconductor device. In this technique, the predetermined area on the surface of silicon substrate is selectively oxidized thermally using a silicon nitride film as an oxidation preventing mask and the oxide film formed thereby is defined as an element isolation area. An oxide film formed in the element isolating film is generally referred to as a "field oxide film".

Since this field oxide film is formed by utilizing the step for the silicon substrate, the mask of the next process can be easily aligned for the preceding process by utilizing this step as the positioning mark.

However, the element isolation by the LOCOS method has the following disadvantages.

One problem is the "bird's beak" phenomenon. This "bird's beak" widens the field oxide film area, resulting in a problem that the element isolation area becomes narrower.

Another problem is the "thinning effect" phenomenon. In this case, when the width of element isolating area becomes narrow, the film becomes thinner. Therefore, there arises a problem in that element isolation is no longer perfect.

These problems are well-known, but when element size is relatively large, the influences of the bird's beak and the thinning phenomena have not been significant.

However, with further improvement in micro-miniaturization of a semiconductor device, not only the element but also an element isolation area are also micro-miniaturized and thereby these problems have become significant.

As an element isolation structure which does not generate such a problem, trench isolation has been known in which a trench is formed on a silicon substrate and an insulator or a polycrystalline silicon is buried therein. Of the trench isolation method, a structure referred to as an STI (Shallow Trench Isolation) in which an element isolation is performed with the comparatively shallow trench having a depth of about 1 μm or less is attracting attention and this STI structure is now being investigated for practical use.

However, even in this s forming process, there is a problem in that if it is attempted to apply the STI structure to the positioning mark, a sufficient step cannot be attained and therefore it cannot be utilized as the positioning mark. Therefore, it is difficult to directly use the positioning mark attained by using the field oxide film even in the STI structure.

Therefore, even in the case where an STI is used, the mark forming process explained below may be thought as a method to maintain in the element forming area the flatness of the burying element isolation structure and to realize the mark structure which may be stably detected.

Namely, the element isolating method utilizing an STI will be explained with reference to FIGS. 6–8. In the Figs., x indicates an element forming area, while y indicates a positioning mark forming area.

First, as illustrated in FIG. 6A, after an oxide film 102 is formed in the thickness of 10 nm on the silicon substrate 101, a silicon nitride film 103 is formed in with a thickness of 100 nm on the entire surface by the CVD method. Subsequently, an aperture is formed by etching the silicon nitride film 103 and the oxide film 102 with the patterned resist mask (not illustrated) and trenches 104a, 104b are formed, each having a depth of about 0.5 μm by the RIE (Reactive Ion Etching) method on the lower silicon substrate 101.

Next, as illustrated in FIG. 6B, after the resist mask is peeled, the internal wall of the trench is thermally oxidized to form a thermally oxidized film (not illustrated) having a thickness of 5 nm. The silicon oxide film 105 is formed to have a thickness of 1 μm on the entire surface by the CVD method and the inside of the trenches 104a, 104b are filled with silicon oxide film 105.

Next, as illustrated in FIG. 6C, after adequate heat treatment is applied, the silicon oxide film 105 on the silicon nitride film 103 is removed by CMP (Chemical Mechanical Polishing) or by RIE and a burying oxide film 105a in the element forming area x and a burying oxide film 105b in the positioning mark forming area y are formed.

Next, as illustrated in FIG. 7D, the silicon nitride 103 is removed using phosphoric acid. Next, the oxide film 102 on the silicon substrate 101 is removed by hydrofluoric acid. In this case, the step between the burying oxide films 105a, 105b and the silicon substrate 101 becomes almost flat in the level difference under about 30 nm. Moreover, the surface of silicon substrate 101 is thermally oxidized to form a thermally oxidized film 106 on the entire surface.

Next, as illustrated in FIG. 7E, the p-type and n-type impurity ions are selectively implanted several times to the silicon substrate 101 in different energies and different dosages and the wells 107a to 107f are formed by application of heat treatment for activation of such impurity.

Next, as illustrated in FIG. 7F, in view of protecting the element forming area x, the resist 108 is coated, the resist 108 is selectively removed in the positioning mark forming area y using the lithography method to expose only the substrate surface at the area near the mark through the aperture 108a.

In this case, a distance of about 200 μm is maintained between the element forming area x and positioning mark. Therefore, since higher accuracy is not required for the positioning in the lithography, the patterning of the resist 108 can be realized easily even if the accurate mark position is not detected.

Next, a step 108b as deep as about 400 nm is formed by selectively removing the thermally oxide film 106 and burying oxide film 105b in the area y using $NH_4F$ etching. In this case, since the element forming area x is protected by the resist 108, the burying oxide film 105a is never etched and flatness of the element forming area x can be maintained.

Next, as illustrated in FIG. 8G, the resist 108 is removed. Thereby, the burying element isolation having the positioning mark consisting of the step 108b as deep as about 400 nm can be realized while keeping the flatness of the element forming area x. Thereafter, the thermal oxide film 106 is removed using hydrofluoric acid.

Next, as illustrated in FIG. 8H, a gate oxide film 109 is formed by the thermal oxidation of the surface of the element forming area of the silicon substrate 101. A polysilicon layer 110 which will become the gate electrode is formed on the gate oxide film 109. The photoresist is formed to the entire surface and the positioning is performed by utilizing the step of the polysilicon layer 110 formed on the positioning mark in order to form the resist pattern 111.

Next, as illustrated in FIG. 8I, using the resist pattern 111, the polysilicon layer 110 is etched to form a gate electrode 110a. Moreover, impurity diffused layers (not illustrated) which will become the source and drain are formed on the silicon substrate 101 in both sides of the gate electrode 110a.

In general, in the manufacture of a semiconductor device, reduction of manufacturing costs is desirable and an increase in the number of manufacturing processes must be avoided as much as possible. As explained above, addition of the three processes of lithography process, etching process and resist removing process to form the step 108b will impede reduction of manufacturing cost.

However, the STI structure must be employed to realize further micro-miniaturization, particularly the flatness of the semiconductor device.

SUMMARY OF THE INVENTION

It is therefore an object of the present invention to provide a method of manufacturing a semiconductor device which can form the positioning mark without a increase in the number of the manufacturing steps while attaining flatness in the element forming area.

According to one aspect of the present invention, there is provided a method of manufacturing a semiconductor device comprising the steps of: etching a semiconductor substrate and forming a trench as a positioning mark on said semiconductor substrate, forming a burying film to fill the trench, forming a mask layer having an aperture to expose the trench, introducing an impurity to the trench with the mask layer used as the mask, and recessing the burying film in the trench which becomes the positioning mark.

Namely, the present invention is characterized in simultaneously implanting ions also to the burying oxide film in the positioning mark forming area during ion implantation to the well. Thereby, at the time of processing by hydrofluoric acid to remove the oxide film in the element forming area, the etching rate of the burying oxide film in the positioning mark forming area can be improved to form the step which will become a self-aligning positioning mark Therefore, even when the STI structure is introduced as in the case of related art, it is no longer required to form the positioning mark by adding new processes and much contribution can be made for improvement of throughput in manufacture of the semiconductor device.

DETAILED DESCRIPTION OF THE PREFERRED EMBODIMENT

Figure 1A:
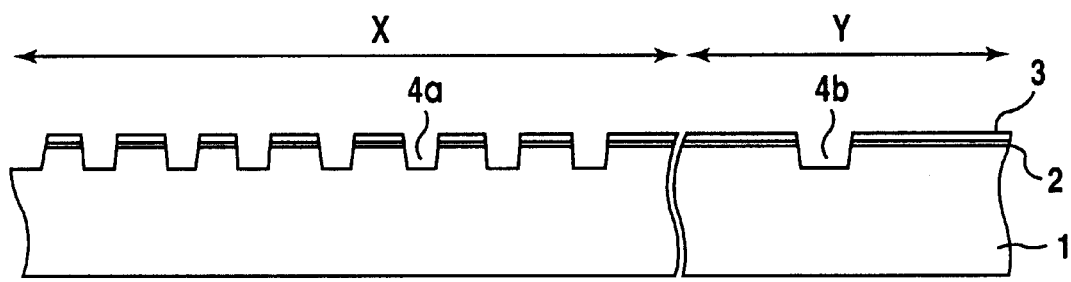
FIGS. 1A to 1C are cross-sectional views (1) illustrating the process of a semiconductor device for explaining the preferred embodiment of the present invention.

A preferred embodiment of the present invention will be explained with reference to the accompanying drawings.

The preferred embodiment of the present invention is illustrated in FIG. 1 to FIG. 5.

In these Figs., the reference numeral 1 designates a p-type silicon substrate; 2, a pad oxide film; 3, a stopper layer; 4a, 4b, trenches; 5a, a burying oxide film in the element forming area; 5b, a burying oxide film in the positioning mark forming area; 6, a silicon oxide film which will become a sacrifice oxide film; 7A to 7G, resist masks; 7a to 7d, ion implantation areas; 8, a step; 9, a gate insulating film; 10a, a gate electrode; 11, a resist mask; X, an element forming area of DRAM memory and logic circuit or the like; Y, a positioning mark forming area.

FIG. 1A to FIG. 4M are cross-sectional views for explaining the processes used in manufacturing a semiconductor device in the preferred embodiment of the present invention. FIG. 5 is a graph indicating the relationship between the amount of ion implantation and etching rate of an oxide film implanted. A method of manufacturing a semiconductor device of the present preferred embodiment will be explained with reference to the accompanying drawings.

Referring to FIG. 1A, the surface of the p-type silicon substrate 1 is thermally oxidized to form a silicon oxide film 2 having a thickness of 5 to 50 nm which will become the pad oxide film. Next, the silicon nitride film 3 is formed to have a thickness of 40 to 150 nm which will become the stopper layer on the entire surface by the CVD method.

The photoresist is coated on the entire surface and it is then exposed and developed to form a resist mask (not illustrated). Thereafter, using the resist mask as the mask, an aperture is formed by patterning the silicon nitride film 3 and the silicon oxide film 2 by the RIE process using the mixed gas of $CF_4$, $CHF_3$ and Ar or the mixed gas of $CF_4$ and Ar. Thereafter, the resist mask is removed.

Using the silicon nitride film 3 as the mask, the trenches 4a, 4b are formed in the depth of 0.1 to 0.5 $\mu$m by etching the silicon substrate 1 by the RIE process using the mixed gas of HBr, $CF_4$ and $O_2$ or the mixed gas of $Cl_2$ and $O_2$. In this case, since the side surface of the trench is tilted by adding $O_2$ as the reaction gas, concentration of electric field applied on the shoulder part (upper edge part) of the trench can be alleviated by such tilting.

As the mask to form the trenches 4a, 4b, a photoresist, an oxide film and a conductive film such as TiN or the like may be used as well as the silicon nitride film 3.

Figure 1B:
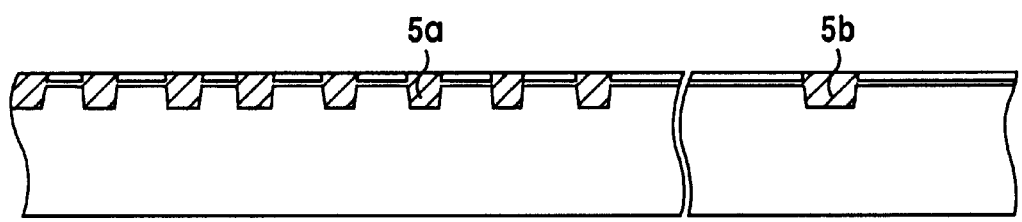

Referring to FIG. 1B, a silicon oxide film (not illustrated) is formed as the substrate protection layer having a thickness of 5 to 50 nm at the internal wall surface of the trench of the silicon substrate 1 by thermal oxidation at a temperature of about 900 to 1050° C.

Next, a silicon oxide film is grown in the thickness of about 0.6 to 1 μm by the CVD method using the mixed gas of $SiH_4$ and oxygen or a mixed gas of TEOS and ozone in such a manner so as to cover the silicon nitride film 3 and bury the insides of the trenches 4a, 4b.

After the growth of the silicon oxide film, the density of the silicon oxide film is increased as required by annealing under a temperature of about 1000° C. In addition, using silicon nitride film 3 as a stopper, the silicon oxide film is polished by a CMP to remove the silicon oxide film on the silicon nitride film 3.

The polishing is performed by holding the silicon substrate 1 between the rotating upper and lower levels (not illustrated). The rotating speed of the upper and lower levels is set to 20 rpm, pressure between the upper and lower levels is set to 5 PSI, back pressure is set to 5 PSI and a slurry mainly composed of colloidal silica or cerium oxide-based slurry is used as the polishing agent. Under this condition, the etching rate of the silicon nitride film 3 is rather low as the completing point of the polishing. Thereby, the burying oxide films 5a, 5b can be respectively formed in the trenches 4a, 4b.

On the occasion of removing the silicon oxide film to form the element isolation structure explained above from above the silicon nitride film 3, the CMP has been used but the RIE process using the mixed gas of $CF_4$ and Ar may also be applied.

Figure 1C:
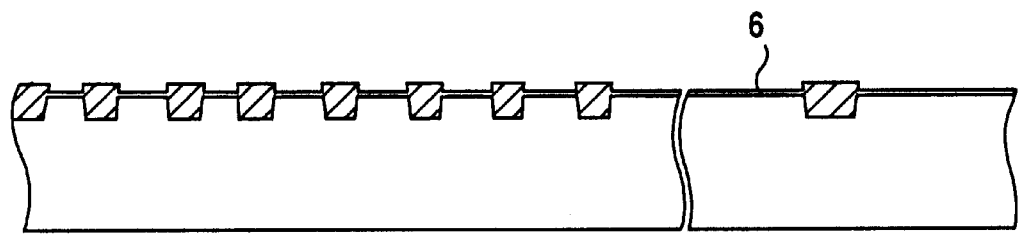

Referring to FIG. 1C, when the silicon nitride film 3 is removed by the hot phosphoric acid solution, the surface of the silicon oxide film 5a, 5b burying the trenches 4a, 4b appears on the silicon substrate 1.

The etching process of the silicon nitride film 3 may be wet etching by the hot phosphoric acid and may also be dry etching using a gas selected from the group consisting of $CF_4$, $CHF_3$, HBr, $SF_6$, $O_2$ and Ar.

Next, the silicon oxide film 2 remaining on the silicon substrate 1 is removed with reduced hydrofluoric acid and moreover a sacrificial layer of oxide film 6 is grown by thermally oxidizing the surface of the silicon substrate 1.

Figure 2D:
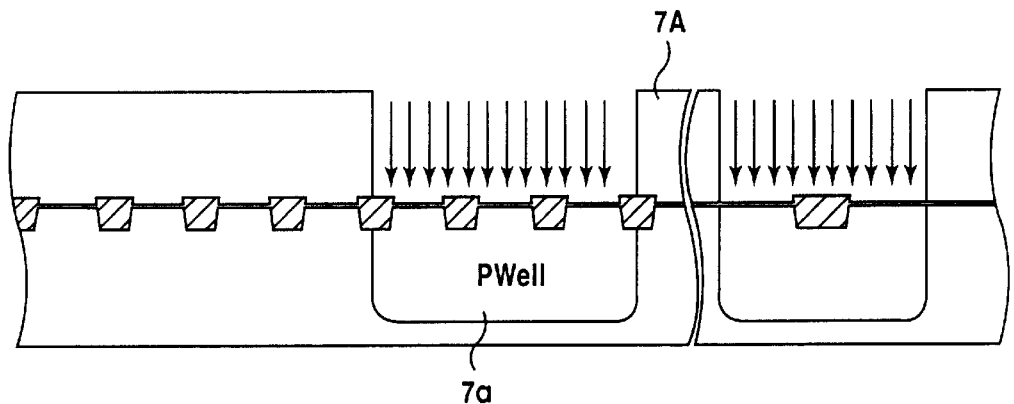
FIGS. 2D to 2F are cross-sectional view (2) illustrating the process of a semiconductor device for explaining the preferred embodiment of the present invention.

Referring to FIG. 2D, using the resist mask 7A having an aperture to form the p-well 7a to the element forming area X and having an aperture to the positioning mark forming area Y, a boron ion, for example, is implanted twice under the condition that the acceleration energy is 260 keV, dosage is $2\times10^{12}$ cm$^{-2}$ and acceleration energy is 80 keV and dosage is $6\times10^{12}$ cm$^{-2}$.

Figure 2E:
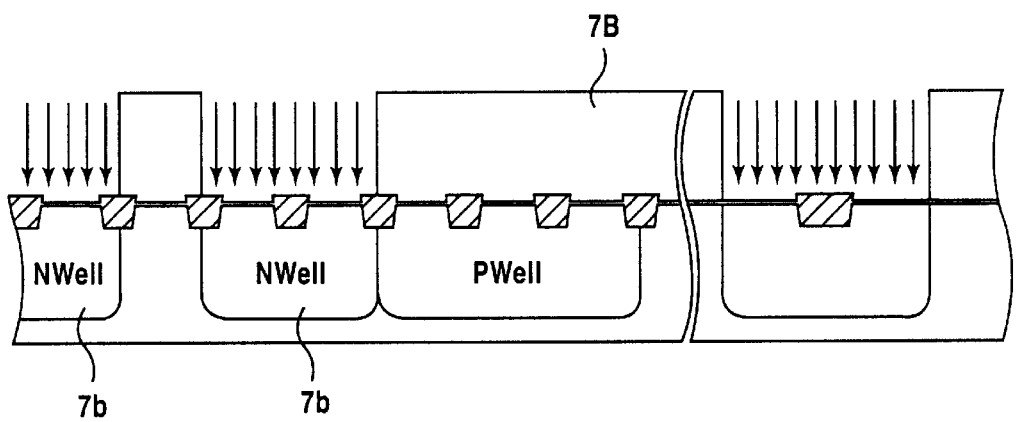

Referring to FIG. 2E, using the resist mask 7B having an aperture to form the n-well 7b to the element forming area X and having an aperture to the positioning mark forming area Y, the phosphorus ion, for example, is implanted twice under the condition that the acceleration energy is 600 keV, dosage is $5\times10^{13}$ cm$^{-2}$ and acceleration energy is 150 keV and dosage is $3\times10^{12}$ cm$^{-2}$.

Figure 2F:
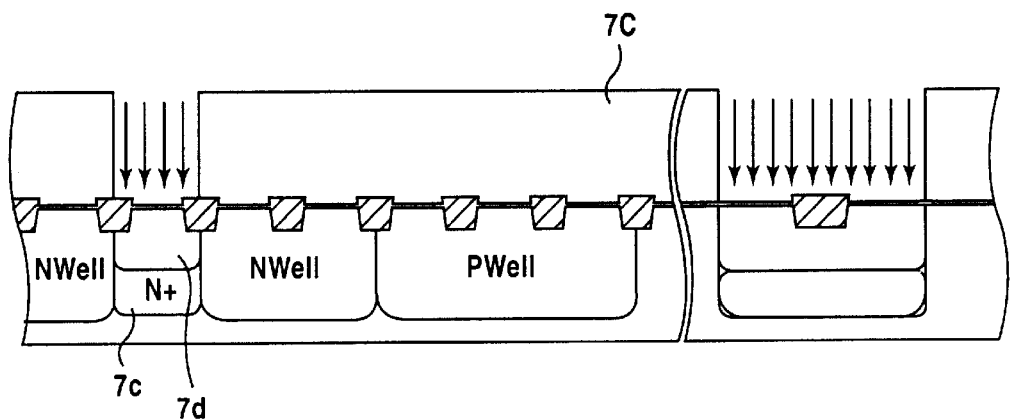

Referring to FIG. 2F, using the resist mask 7C having an aperture to form the n-well 7c in the element forming area X and having an aperture to the positioning mark forming area Y, the phosphorus ion, for example, is implanted under the condition that the acceleration energy is 1.5 MeV and dosage is $2\times10^{13}$ cm$^{-2}$. Moreover, the boron ion, for example, is implanted, to form the p-well 7d, under the condition that the acceleration energy is 260 keV and dosage is $2\times10^{13}$ cm$^{-2}$.

Figure 3G:
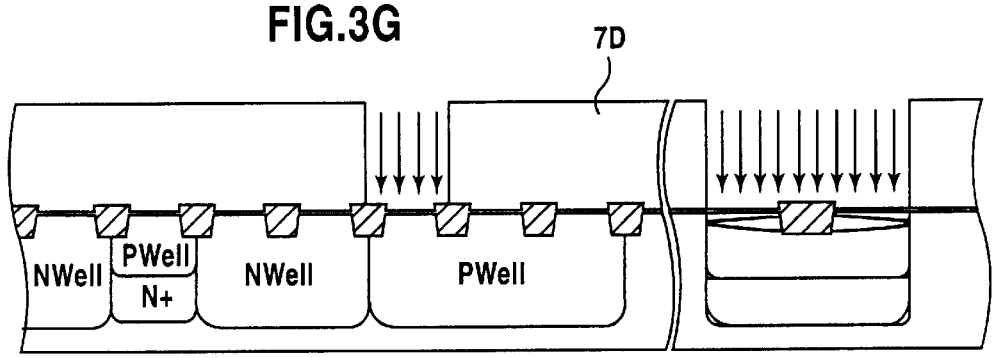
FIGS. 3G to 3J are cross-sectional view (3) illustrating the process of a semiconductor device for explaining the preferred embodiment of the present invention.

Referring to FIG. 3G, using the resist mask 7D having an aperture to implant the ions to control the threshold voltage to the element forming area X and having an aperture to the positioning mark forming area Y, the $BF_2$ ion, for example, is implanted under the condition that the acceleration energy is 15 keV and dosage is $2.5\times10^{12}$ cm$^{-2}$.

Figure 3H:
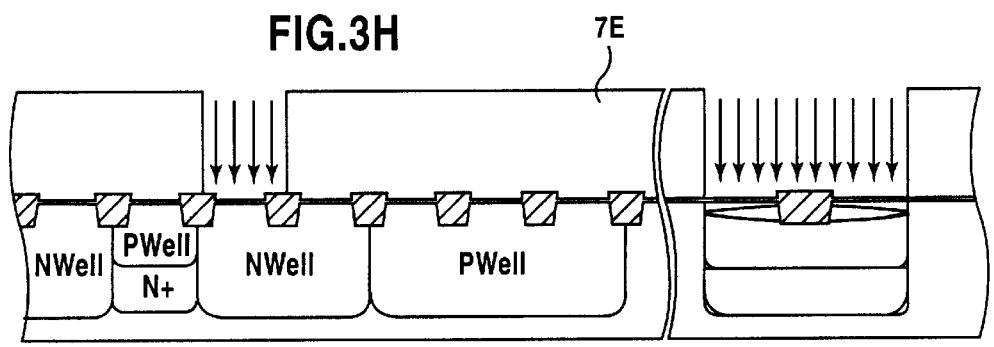

Referring to FIG. 3H, using the resist mask 7E having an aperture for implanting ions to control the threshold voltage to the element forming area X and an aperture to the positioning mark forming area Y, the phosphorus ion, for example, is implanted under the condition that the acceleration energy is 20 keV and dosage is $3\times10^{12}$ cm$^{-2}$.

Figure 3I:
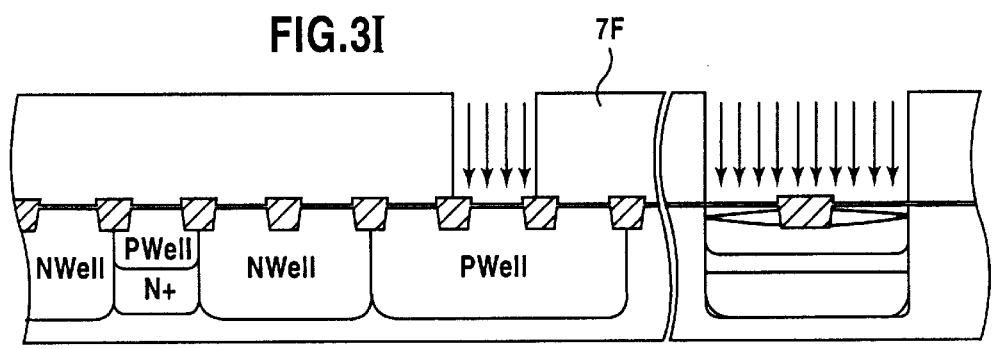

Referring to FIG. 3I, using the resist mask 7F having an aperture for implanting ions to control the threshold voltage to the element forming area X and an aperture to the positioning mark forming area Y, the $BF_2$ ion, for example, is implanted under the condition that the acceleration energy is 15 keV and dosage is $5\times10^{12}$ cm$^{-2}$.

Figure 3J:
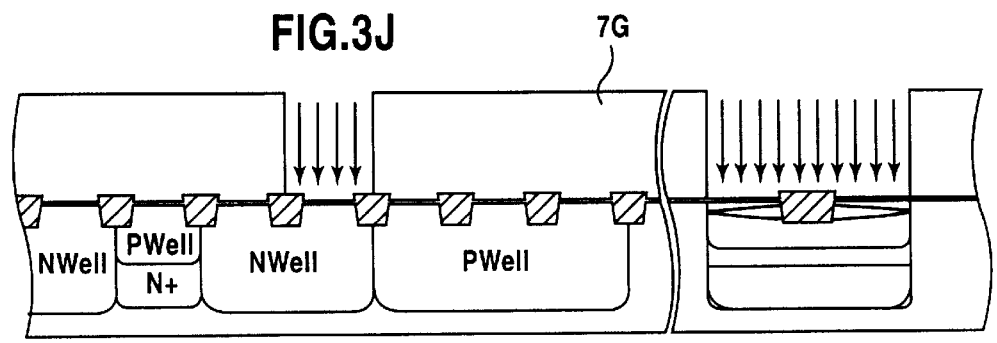

Referring to FIG. 3J, using the resist mask 7G having an aperture for implanting ions to control the threshold voltage to the element forming area X and an aperture to the positioning mark forming area Y, the phosphorus ion, for example, is implanted under the condition that the acceleration energy is 20 keV and dosage is $5\times10^{12}$ cm$^{-2}$.

The apertures of the resist masks 7A to 7G in the positioning mark forming area are required to expose the trench 4b, the silicon oxide film 5b filling the trench 4b and the boundary between the trench 4b formed to the silicon substrate 1 and the silicon substrate 1, in other words, the end portion of the trench 4b. Exposure of this end portion enables direct observation of the trench 4b in the later hydrofluoric acid process in order to use it in the positioning mark in the later process.

Here, even when the apertures of the resist masks 7A to 7G in the positioning mark area exposes only the internal side of the trench 4b, an etching rate of the area in which ion implantation is multiplexed becomes higher and thereby the step can be formed. However, in this case, the step does not enable observation of the trench 4b already formed but enables only dim observation of the ion-implanted area and it therefore cannot be used directly for accurate positioning.

Moreover, positioning between the resist masks 7A to 7G and the silicon substrate 1 can be made through difference of optical constants of the burying oxide film 5b and the silicon substrate 1. Therefore, even when the surface of the burying oxide film 7b and the surface of the silicon substrate 1 are substantially flat, positioning between the resist masks 7A to 7G and the silicon substrate 1 can be made.

Moreover, impurity introduced into the silicon substrate 1 by ion implantation is not yet activated but is activated first by the heat treatment in the post-process to form the well. For the convenience of explanation in this specification, the ion implanted area immediately after the ion implantation is also called a "well" or "diffused layer".

As explained above, a total amount of ions of about $1.315\times10^{14}$ cm$^{-2}$ may be implanted by providing an aperture also to the positioning mark forming area and then implanting the ions to the burying insulating film 5b at the time of ion implantation to the well.

In addition, in this embodiment, in the ion implantation process to form all wells, an aperture has been provided to the positioning mark forming area for the ion implantation but it is not always required to provide such an aperture for every ion implanting process.

FIG. 5 is a graph illustrating the relationship between the ion implantation amount and etching rate of a silicon oxide film. The vertical axis indicates an etching rate ratio of the silicon oxide film surface in the case the ion implantation is performed to the case where the ion implantation is not performed, while the horizontal axis indicates the amount of ion implantation ($cm^{-2}$).

This graph suggests that when the ion implantation amount is about $1 \times 10^{12}$ $cm^{-2}$ or less, an etching rate of the silicon oxide film is almost identical without relation to ion implantation to the silicon oxide film. Moreover, it can be understood that when the ion implantation amount is about $1 \times 10^{13}$ $cm^{-2}$, the etching rate is improved by about 10% in comparison with the case where the ion implantation is not performed.

Namely, when the ion implantation amount is about $5 \times 10^{13}$ $cm^{-2}$ or more, or more preferably $1 \times 10^{14}$ $cm^{-2}$ or more, the etching rate of the oxide film for the hydrofluoric acid can considerably be improved.

Therefore, it is not always required to provide such an aperture for all ion implantation processes when the condition that dosage becomes $5 \times 10^{13}$ $cm^{-2}$ or more to the burying oxide film of the positioning mark forming area is satisfied by performing single ion implantation or combining several ion implantation processes.

Figure 4K:
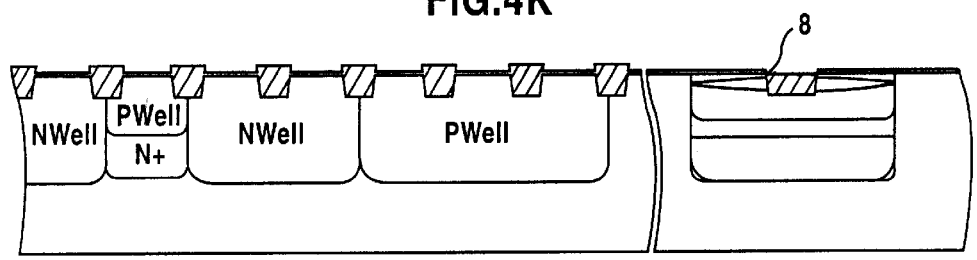
FIGS. 4K to 4M are cross-sectional view (4) illustrating the process of a semiconductor device for explaining the preferred embodiment of the present invention.
Figure 5:
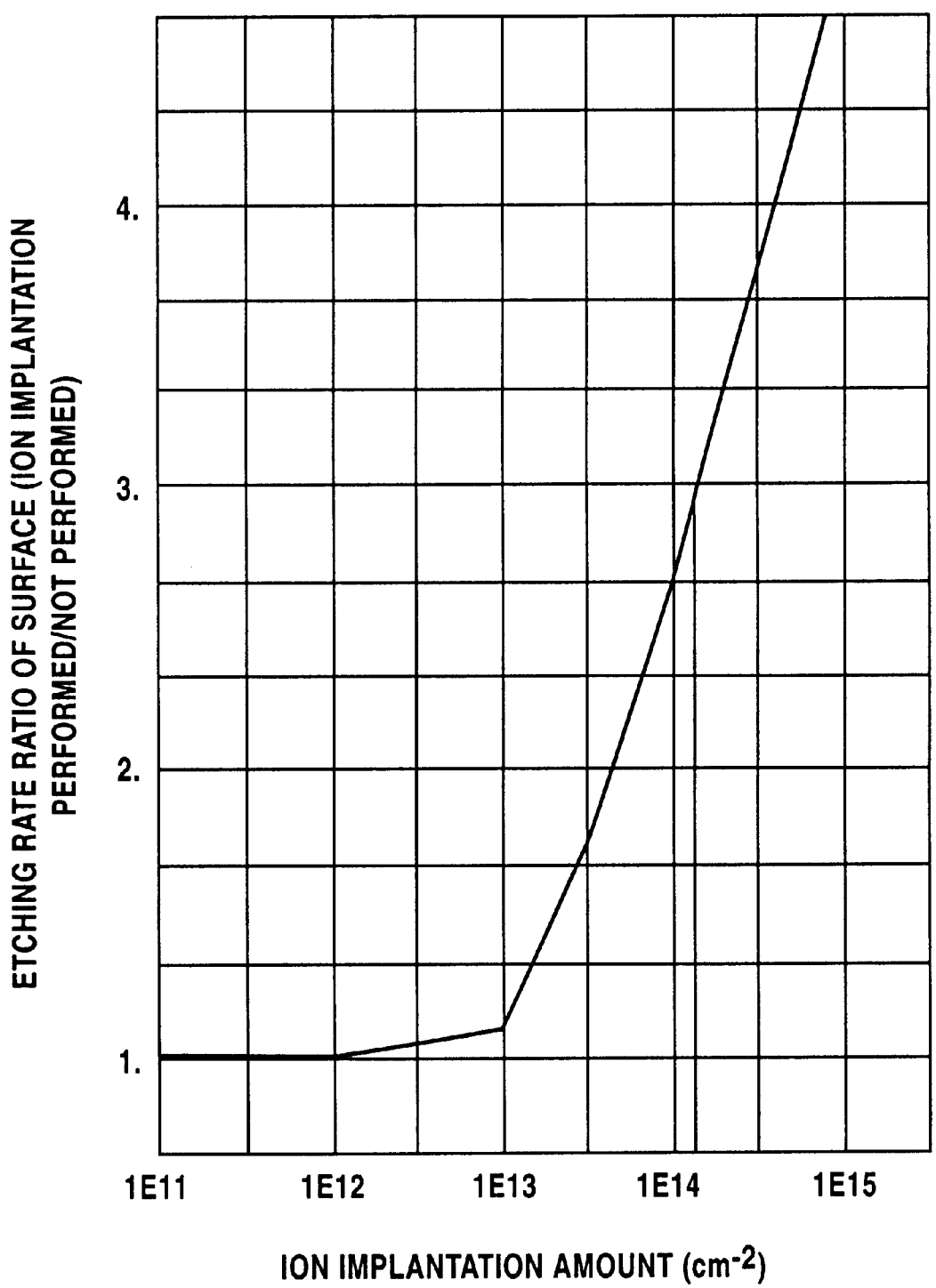
FIG. 5 is a graph illustrating the relationship between ion implantation amount and etching rate of an oxide film implanted.
Figure 6A:
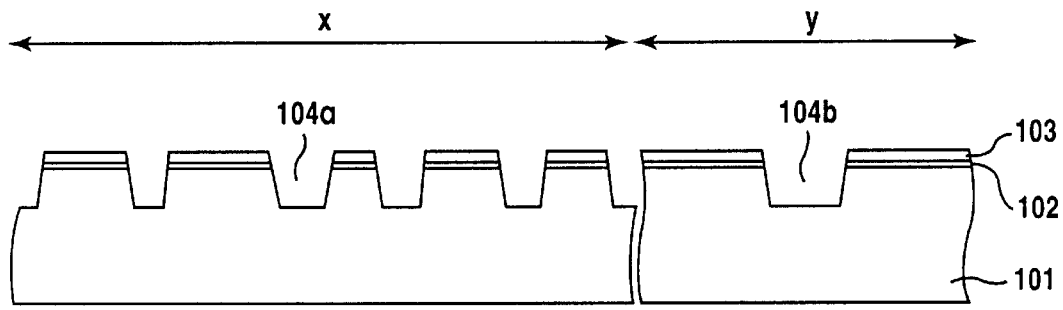
FIGS. 6A to 6C are cross-sectional view (1) illustrating an example of the semiconductor device manufacturing process of the prior art.
Figure 6B:
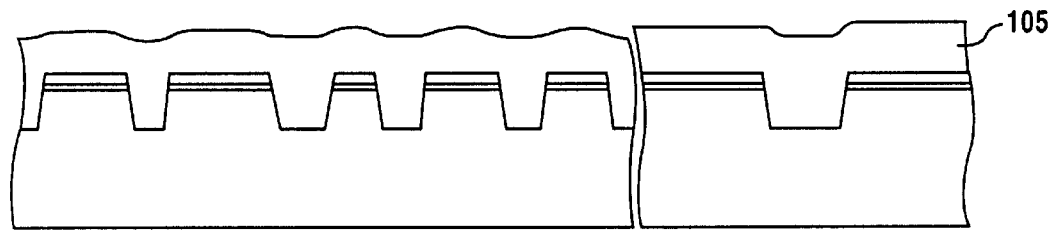
Figure 6C:
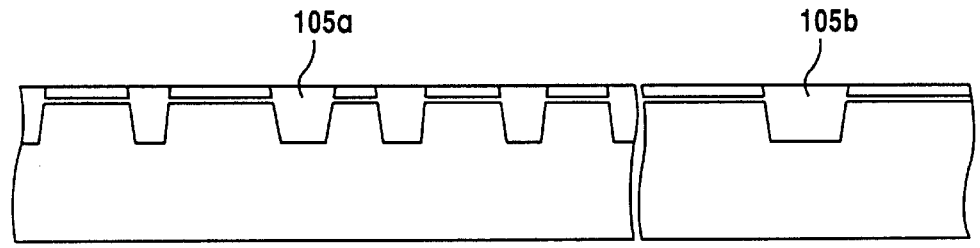
Figure 7D:
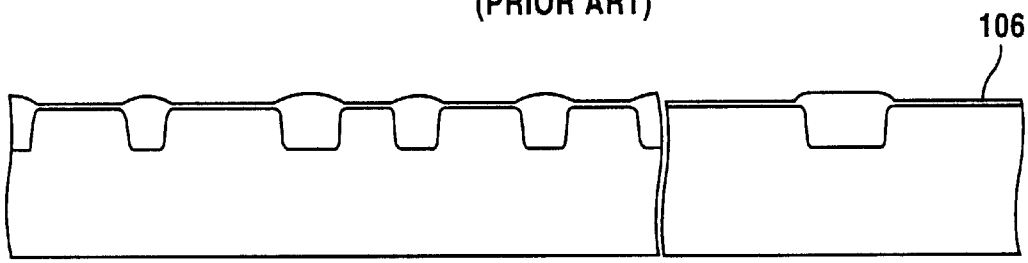
FIGS. 7D to 7F are cross-sectional view (2) illustrating an example of the semiconductor device manufacturing process of the prior art.
Figure 7E:
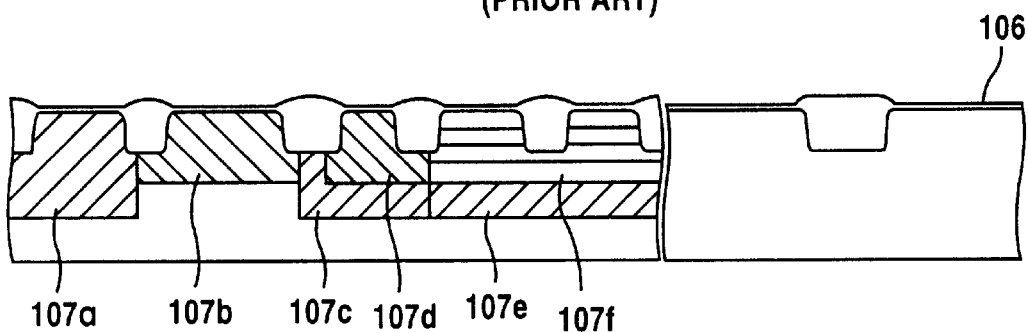
Figure 7F:
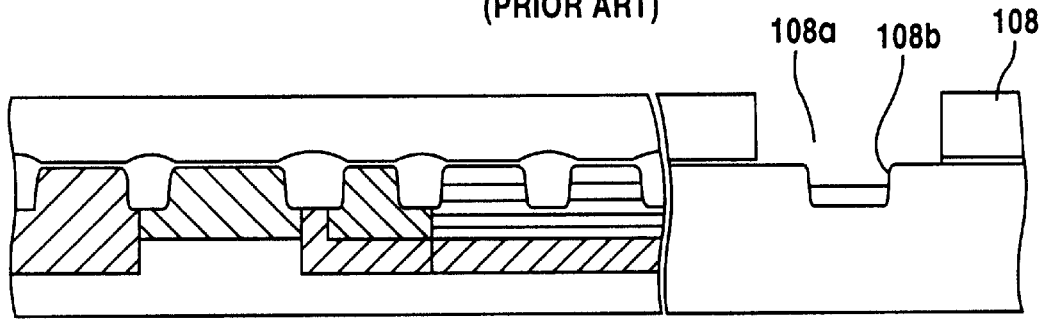
Figure 8G:
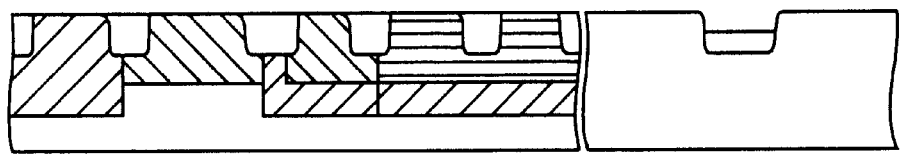
FIGS. 8G to 8I are cross-sectional view (3) illustrating an example of the semiconductor device manufacturing process of the prior art.
Figure 8H:
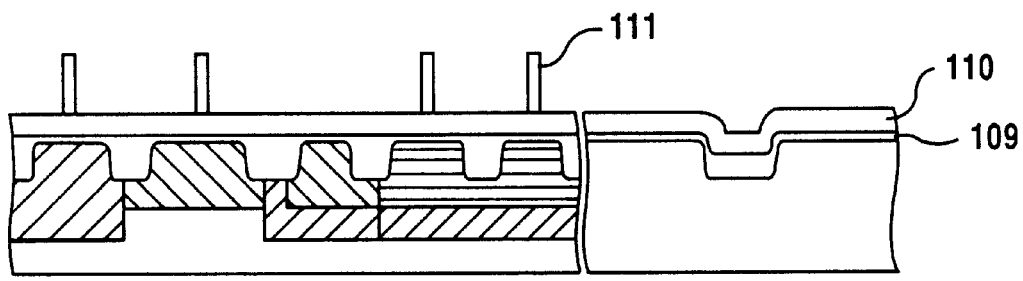
Figure 8I:
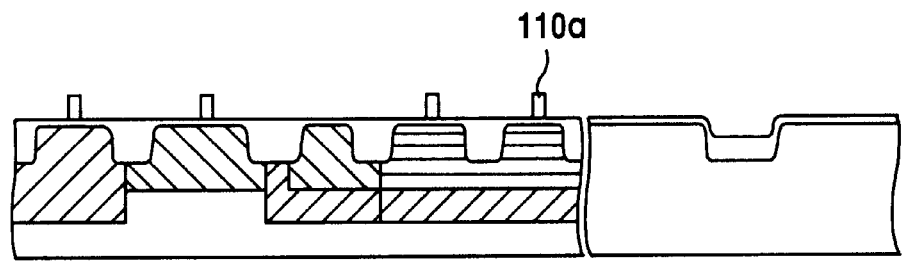

Referring to FIG. 4K, after the resist mask 7G is removed, the sacrificial oxide film 6 is removed through control etching of 3 to 10 minutes with the reduced hydrofluoric acid, for example, in the concentration of about 2 to 5%.

As a result, in the element forming area X, the sacrificial oxide film 6 is removed to expose the silicon substrate 1 and the burying oxide film 5a is also etched so that the surface of substrate 1 and the surface of burying oxide film 5a substantially become flat. Moreover, in the positioning area Y, since a large number of ions, as large as about $1.315 \times 10^{14}$ $cm^{-2}$, is implanted to the burying oxide film 5a, the etching rate of the burying oxide film 5b becomes very high due to the implanted impurity and damage at the time of implantation and thereby the step 8 is formed in the level lower than the surface of substrate 1 by about 30 nm or more. However, the step required depends on the mark reading performance of the exposing apparatus to be used.

In this case, in the element forming area X, since a plurality steps of the ion implantation are never performed, the ion dosage is under $5 \times 10^{13}$ $cm^{-2}$ and therefore even when the hydrofluoric acid process is conducted, a step higher than 30 nm is never formed.

As the mechanism for enhancing the etching rate of the oxide film by ion implantation, the following three reasons may provided.

Namely, (1) influence of impurity (B, P, As or the like) introduced into the oxide film; (2) influence of damage formed in the oxide film due to the ion implantation, for example, influence of disconnection of coupling between Si atoms and O atoms; and (3) dependence, although not to a large extent, on ion seeds introduced into the oxide film.

Namely, since the etching rate changes depending not only on the amount of impurities in the oxide film but also on damage, it also depends not only on the dosage but also on acceleration energy at the time of ion implantation. When acceleration energy becomes higher, the etching rate becomes higher because damage in the oxide film also increases. When the acceleration energy becomes higher, the impurity itself is introduced to the area deeper from the surface passing the surface and therefore damage is also formed at the surface. This damage is particularly formed in a large amount at the surface and at the area a little deeper than the average flying distance of the ion implantation from the surface.

As explained above, the etching rate of the surface of oxide film depends on the distribution and kind of impurity at the area near the surface and the distribution of damage. As an example, the relationship between the etching rate and dosage of ion implantation has been explained with reference to FIG. 5. In actuality, however, since a plurality ion implantations are performed in various ion seeds, dosages, acceleration and energies, such an etching rate is a little different from the actual etching rate. Moreover, since the condition of ion implantation changes depending on the characteristic of the transistors required, the etching rate must be obtained using the ion implantation condition to be used actually as the final condition.

Moreover, when the heat treatment is conducted before the hydrofluoric acid process after the ion implantation, damage explained above may be recovered to lose the effect of improving the etching rate. Therefore, it is desirable to form a step by the hydrofluoric acid process before activation of the implanted impurity.

Figure 4L:
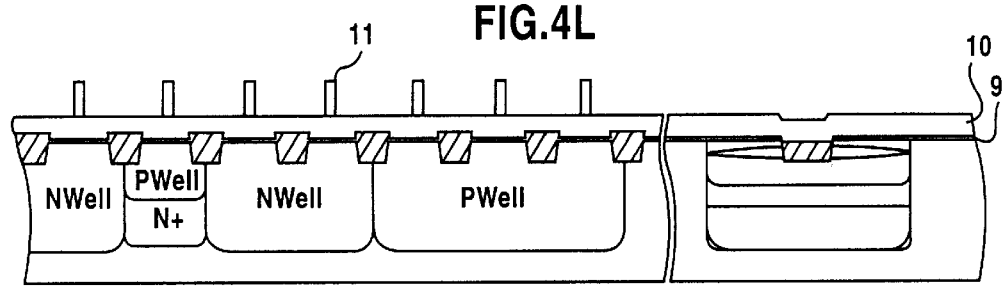

Referring to FIG. 4L, the surface of the silicon substrate 1 is thermally oxidized to form a gate oxide film (gate insulating film) 9 having a thickness of 5 nm and then form a polysilicon layer 10 as the gate electrode on the gate oxide film 9. Here, the photoresist is formed on the entire surface and positioning is performed by utilizing a step formed on the polysilicon layer 10 with the step 8 formed in the positioning mark area Y to form the resist mask 11.

Figure 4M:
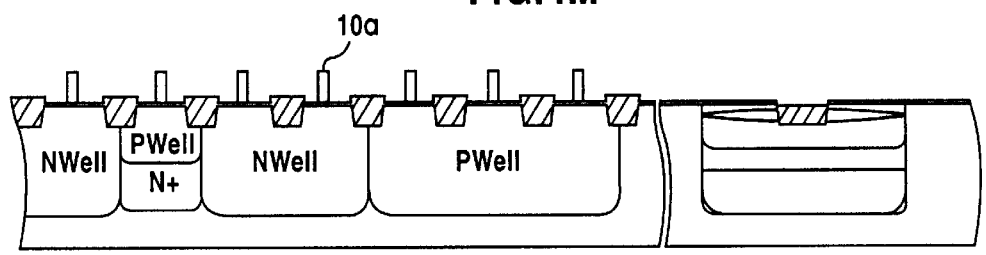

Referring to FIG. 4M, using the resist mask 11, the polysilicon layer 10 is etched to form the gate electrode 10a. Moreover, the impurity diffused layers (not illustrated) are formed as the source and drain on the silicon substrate 1 in both sides of the gate electrode 10a.

According to the present invention, since ion implantation is simultaneously performed to the burying oxide film of the positioning mark forming area at the time of ion implantation to form the well or control the threshold voltage, the etching rate of the burying oxide film of the positioning mark forming area can be improved at the time of hydrofluoric acid process to remove the oxide film in the element forming area Thereby, when a gate electrode is patterned by keeping constant the optical constant of the lower base layer, the step which will become the positioning mark can be formed on the self-aligning basis.

Moreover, when an ion implantation having a dosage such as $1 \times 10^{13}$ $cm^{-2}$ to $1 \times 10^{12}$ $cm^{-2}$ is performed many times, or if a particular ion implantation process is added to obtain a dosage of $5 \times 10^{13}$ $cm^{-2}$ or greater, the number of manufacturing steps cannot be reduced. Therefore, the target dosage can be attained by utilizing a plurality of ion implantation processes including n-type and p-type impurities in the small amount of dosage. Therefore, the step can be formed without an increase in the number of manufacturing steps.

In the embodiment explained above, the p-type silicon substrate is used but the present invention can be applied to the case where an n-type silicon substrate and SOI (Silicon On Insulator) substrate are used.

The present invention has been explained with reference to the above embodiments. But the present invention is not limited thereby and therefore it is apparent for those who are skilled in the art to conduct, for example, various modifications, changes and combinations.

What is claimed is:

1. A method of manufacturing a semiconductor device, comprising the steps of:

etching a semiconductor substrate and forming a trench as a positioning mark on said semiconductor substrate;

forming a burying film to fill said trench;

forming a mask layer having an aperture to expose said trench;

introducing an impurity to said trench with said mask layer used as the mask; and recessing said burying film in said trench which becomes said positioning mark.

2. A method of manufacturing a semiconductor device according to claim 1, wherein said step of introducing an impurity into said trench with said mask layer used as the mask is composed of a step of introducing an impurity of one conductivity type and a step of introducing an implant impurity of the opposite conductivity type which is different from said one conductivity type by utilizing a plurality of masks for introducing said impurities in different portions of a plurality of element forming areas.

3. A method of manufacturing a semiconductor device according to claim 1, wherein a total dosage of ions introduced to said positioning mark area is greater than $5 \times 10^{13}$ $cm^{-2}$.

4. A method of manufacturing a semiconductor device according to claim 1, wherein said step of recessing said burying film in the trench which becomes said positioning mark is performed using a solution including hydrofluoric acid.

5. A method of manufacturing a semiconductor device according to claim 1, wherein said aperture in the positioning mark area of said mask layer exposes the end portion of said trench formed on said semiconductor substrate.

6. A method of manufacturing a semiconductor device according to claim 1, further comprising the steps of:

after said step of recessing said burying film in the trench which becomes said positioning mark, forming a conductive layer on the entire surface; and forming a wiring layer consisting of said conductive layer by patterning said conductive layer utilizing a step formed by recessing said burying film.

7. A method of manufacturing a semiconductor device, comprising the steps of:

forming a first mask layer on a semiconductor substrate having an element forming area and a positioning mark area;

etching said first mask layer and forming a first aperture to said element forming area and a second aperture in said positioning mark area;

etching said semiconductor substrate via said first aperture and said second aperture and forming a first trench in said element forming area and a second trench in said positioning mark area;

forming an insulating film extending above said semiconductor substrate by burying said first trench and said second trench;

removing said insulating film on said first mask layer and forming a burying film consisting of said insulating film in said first trench and said second trench;

forming a second mask layer having an aperture to expose said second trench;

introducing an impurity to said second trench with said second mask layer used as the mask; and recessing said burying film in said trench which becomes said positioning mark.

8. A method of manufacturing a semiconductor device according to claim 7, wherein said step of introducing an impurity into said trench with said second mask layer used as the mask is composed of a step of introducing an impurity of one conductivity type and a step of introducing an impurity of the opposite conductivity type which is different from said one conductivity type by utilizing a plurality of second masks for introducing said impurities in different portions of a plurality of element forming areas.

9. A method of manufacturing a semiconductor device according to claim 7, wherein a total dosage of ions introduced to said positioning mark area is greater than $5 \times 10^{13}$ $cm^{-2}$.

10. A method of manufacturing a semiconductor device according to claim 7, wherein said step of recessing said burying film in the trench which becomes said positioning mark is performed using a solution including hydrofluoric acid.

11. A method of manufacturing a semiconductor device according to claim 7, wherein said aperture in the positioning mark area of said second mask layer exposes the end portion of said second trench formed on said semiconductor substrate.

12. A method of manufacturing a semiconductor device according to claim 7, further comprising the steps of:

after said step of recessing said burying film in the trench which becomes said positioning mark, forming a conductive layer on the entire surface; and forming a wiring layer consisting of said conductive layer by patterning said conductive layer utilizing a step formed by recessing said burying film.

13. A method of manufacturing a semiconductor device according to claim 7, wherein said burying film is a silicon oxide film.

14. A method of manufacturing a semiconductor device comprising the steps of:

forming a first mask layer on a semiconductor substrate having an element forming area and a positioning mark area;

etching said first mask layer and forming a plurality of first apertures in said element forming area and a second aperture in said positioning mark area;

etching said semiconductor substrate via said first apertures and said second aperture and then respectively forming a plurality of first trenches in said element forming area and a second trench in said positioning mark area;

forming an insulating film extending above said semiconductor substrate by burying a plurality of said first trenches and said second trench;

removing said insulating film on said first mask layer and forming a burying film consisting of said insulating film in said a plurality of first trenches and said second trench;

selectively opening said element forming area covering at least one said first trench and forming a second mask layer having an aperture exposing said second trench;

selectively introducing an impurity to said element forming area and said second trench with said second mask layer used as the mask; and recessing the burying film in said trench which becomes said positioning mark.

15. A method of manufacturing a semiconductor device according to claim 14, wherein said step of introducing an impurity into said trench with said second mask layer used as the mask is composed of a step of introducing an impurity of one conductivity type and a step of introducing an implant impurity of the opposite conductivity type which is different from said one conductivity type by utilizing a plurality of second masks for introducing said impurities in different portions of a plurality of element forming areas.

16. A method of manufacturing a semiconductor device according to claim 14, wherein a total dosage of ions introduced to said positioning mark area is greater than $5 \times 10^{13}$ cm$^{-2}$.

17. A method of manufacturing a semiconductor device according to claim 14, wherein said step of recessing said burying film in the trench which becomes said positioning mark is performed using a solution including hydrofluoric acid.

18. A method of manufacturing a semiconductor device according to claim 14, wherein said aperture in the positioning mark area of said second mask layer exposes the end portion of said second trench formed on said semiconductor substrate.

19. A method of manufacturing a semiconductor device according to claim 14, further comprising the steps of:

after said step of recessing said burying film in the trench which becomes said positioning mark, forming a conductive layer on the entire surface; and forming a wiring layer consisting of said conductive layer by patterning said conductive layer utilizing a step formed when said burying film is recessed.

20. A method of manufacturing a semiconductor device according to claim 14, wherein said burying film is a silicon oxide film.

* * * * *